US009449968B2

(12) United States Patent
Irsigler et al.

(10) Patent No.: US 9,449,968 B2
(45) Date of Patent: Sep. 20, 2016

(54) METHOD FOR MANUFACTURING A SEMICONDUCTOR DEVICE AND A SEMICONDUCTOR DEVICE

(71) Applicant: Infineon Technologies Austria AG, Villach (AT)

(72) Inventors: Peter Irsigler, Obernberg am Inn (AT); Johannes Baumgartl, Riegersdorf (AT); Markus Zundel, Egmating (DE); Anton Mauder, Kolbermoor (DE); Franz Hirler, Isen (DE); Rolf Weis, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 62 days.

(21) Appl. No.: 14/141,832

(22) Filed: Dec. 27, 2013

(65) Prior Publication Data
US 2015/0187761 A1    Jul. 2, 2015

(51) Int. Cl.
*H01L 27/088*    (2006.01)
*H01L 21/225*    (2006.01)
(Continued)

(52) U.S. Cl.
CPC .......... *H01L 27/088* (2013.01); *H01L 21/225* (2013.01); *H01L 21/30604* (2013.01); *H01L 21/823418* (2013.01); *H01L 29/0696* (2013.01);
(Continued)

(58) Field of Classification Search
CPC .......... H01L 21/255; H01L 29/66704; H01L 29/41766; H01L 29/0696; H01L 29/0865; H01L 29/66696; H01L 29/4238; H01L 29/7825
USPC ........ 257/334, 345, 331, 343, 328, 330, 335
See application file for complete search history.

(56) References Cited

U.S. PATENT DOCUMENTS 7,423,325 B2 * 9/2008 Tihanyi ............... H01L 29/0634
257/368
7,714,384 B2 * 5/2010 Seliskar .................. H01L 21/84
257/331
(Continued)

FOREIGN PATENT DOCUMENTS

DE    19743342 C2    4/1999
DE    102004063991 B4    5/2008

OTHER PUBLICATIONS

Meiser, A., et al., "Semiconductor Device and Method of Manufacturing a Semiconductor Device." U.S. Appl. No. 13/692,059, filed Dec. 3, 2012.

*Primary Examiner* — Kenneth Parker
*Assistant Examiner* — Bo Fan
(74) *Attorney, Agent, or Firm* — Murphy, Bilak & Homiller, PLLC

(57) ABSTRACT

A semiconductor device is formed by forming: a transistor in a semiconductor substrate having a main surface; a source region and a drain region; and a channel region and a drift zone between the source region and the drain region. The source and drain regions are arranged along a first direction parallel to the main surface. Gate trenches and a gate electrode are formed in the gate trenches. The gate trenches have a distance corresponding to a width d1 of the channel region, where d1≤2*ld and ld denotes a length of a depletion zone formed at an interface between the channel region and a gate dielectric adjacent to the gate electrode. An auxiliary trench formed in the main surface extends in a second direction intersecting the first direction. The source region is formed using a doping method that introduces dopants via a sidewall of the auxiliary trench.

21 Claims, 20 Drawing Sheets

(51) Int. Cl.
*H01L 21/306* (2006.01)
*H01L 21/8234* (2006.01)
*H01L 29/10* (2006.01)
*H01L 29/423* (2006.01)
*H01L 29/66* (2006.01)
*H01L 29/78* (2006.01)
*H01L 29/40* (2006.01)
*H01L 29/417* (2006.01)
*H01L 29/06* (2006.01)
*H01L 29/08* (2006.01)
*H01L 21/223* (2006.01)
*H01L 21/265* (2006.01)

(52) U.S. Cl.
CPC ....... *H01L 29/0865* (2013.01); *H01L 29/1095* (2013.01); *H01L 29/407* (2013.01); *H01L 29/41766* (2013.01); *H01L 29/4236* (2013.01); *H01L 29/4238* (2013.01); *H01L 29/66696* (2013.01); *H01L 29/66704* (2013.01); *H01L 29/7825* (2013.01); *H01L 21/2236* (2013.01); *H01L 21/2254* (2013.01); *H01L 21/2255* (2013.01); *H01L 21/26586* (2013.01); *H01L 29/0878* (2013.01)

(56) References Cited

U.S. PATENT DOCUMENTS

| | | | | |
|---|---|---|---|---|
| 2011/0156140 | A1* | 6/2011 | Zara | H01L 21/2815 257/334 |
| 2011/0241170 | A1* | 10/2011 | Haeberlen | H01L 21/823475 257/532 |
| 2012/0146133 | A1* | 6/2012 | Hirler | H01L 21/76898 257/330 |
| 2012/0267704 | A1* | 10/2012 | Siemieniec | H01L 29/1095 257/328 |
| 2013/0140632 | A1* | 6/2013 | Landgraf | H01L 21/02107 257/335 |
| 2013/0307059 | A1* | 11/2013 | Weis | H01L 29/66734 257/330 |
| 2014/0015048 | A1* | 1/2014 | Ng | H01L 29/407 257/335 |

* cited by examiner

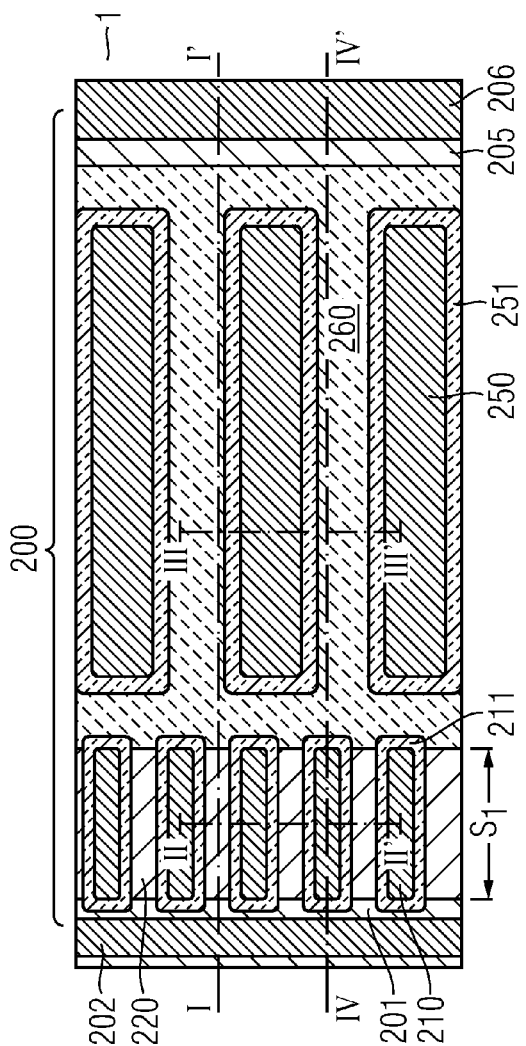
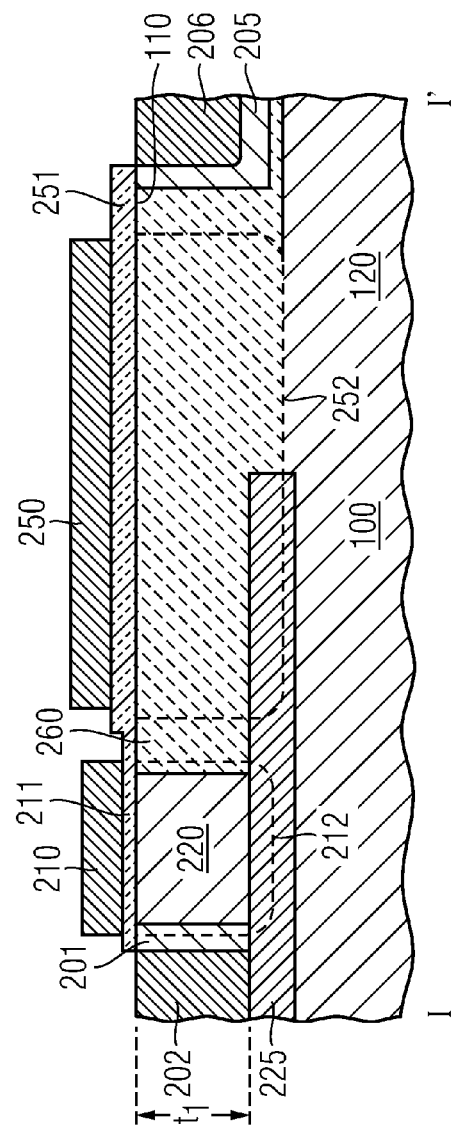

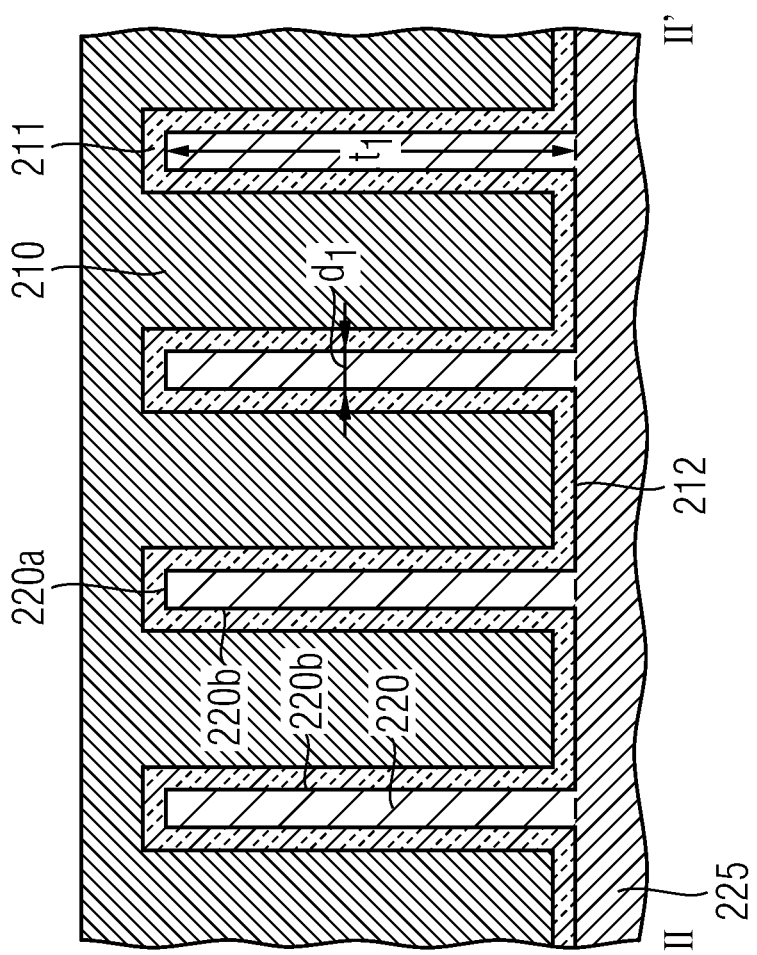

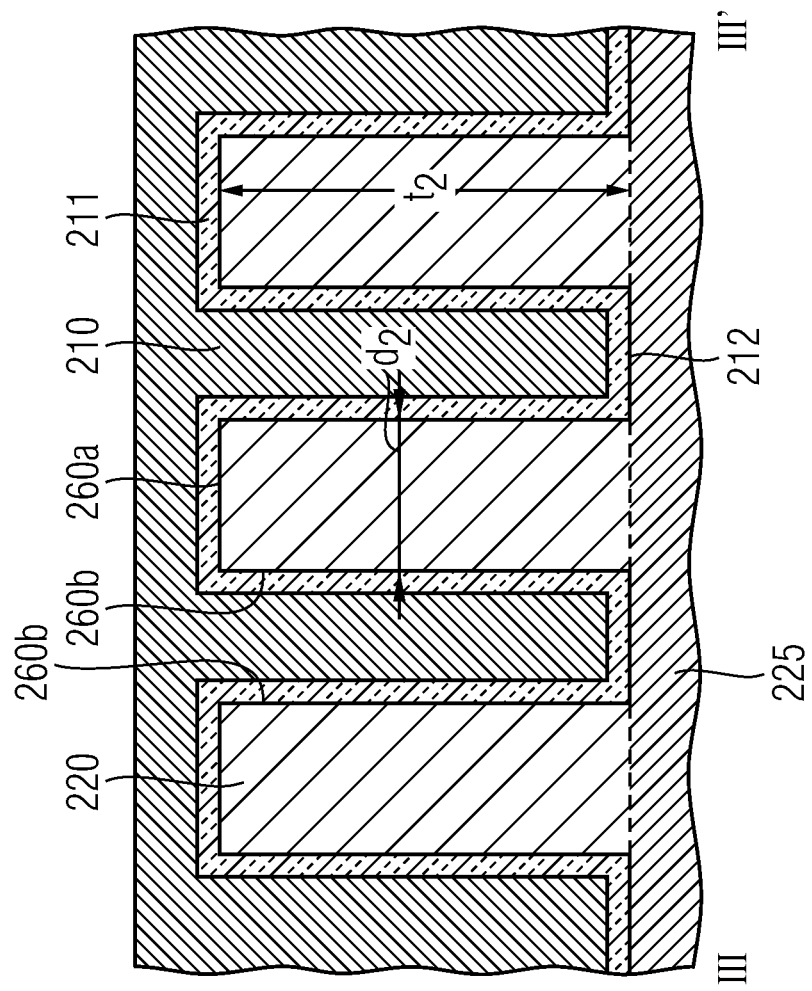

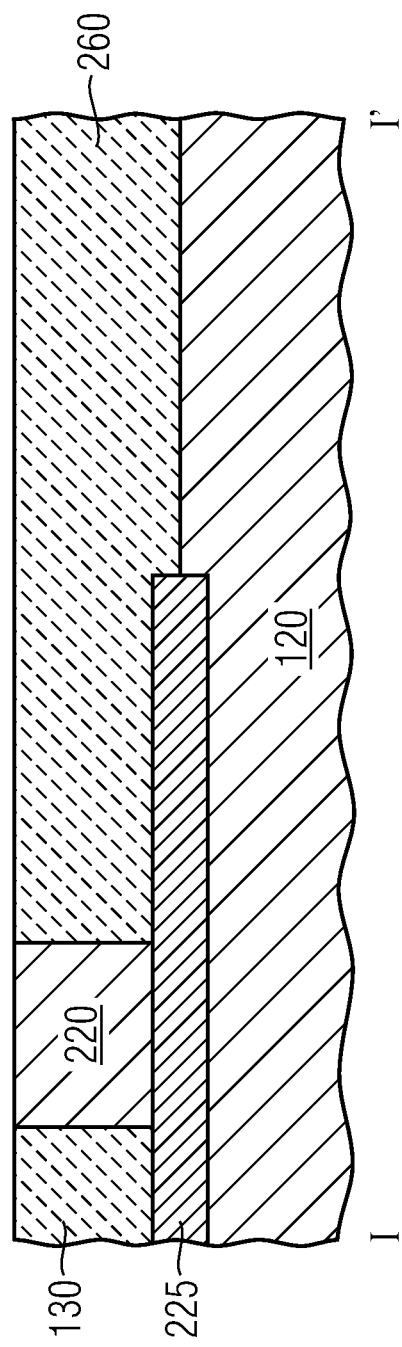

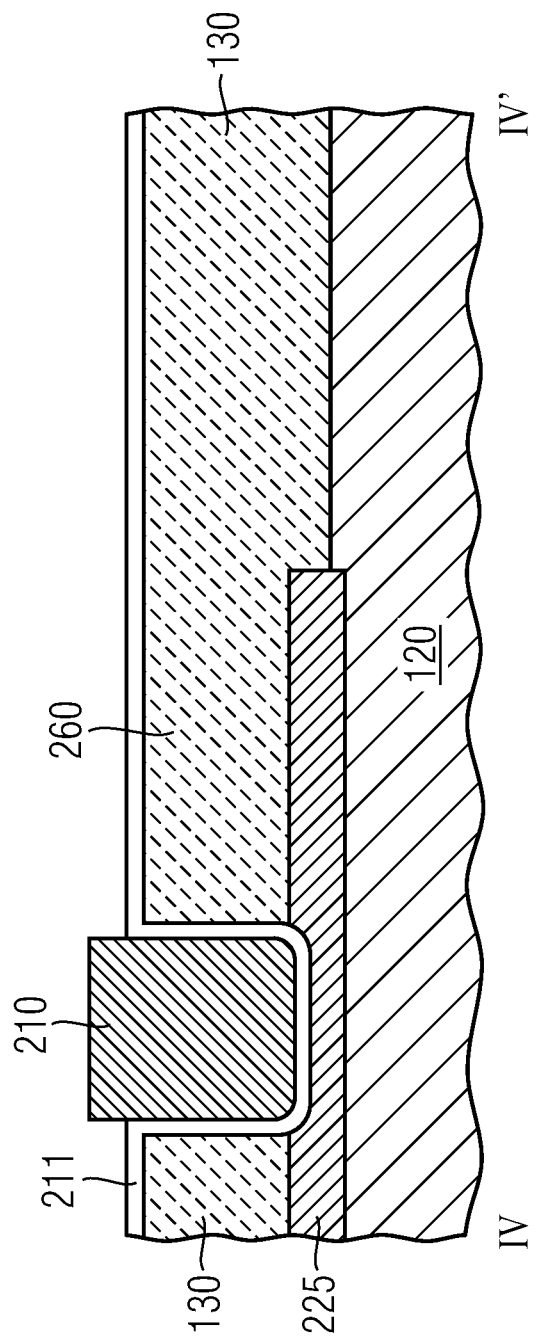

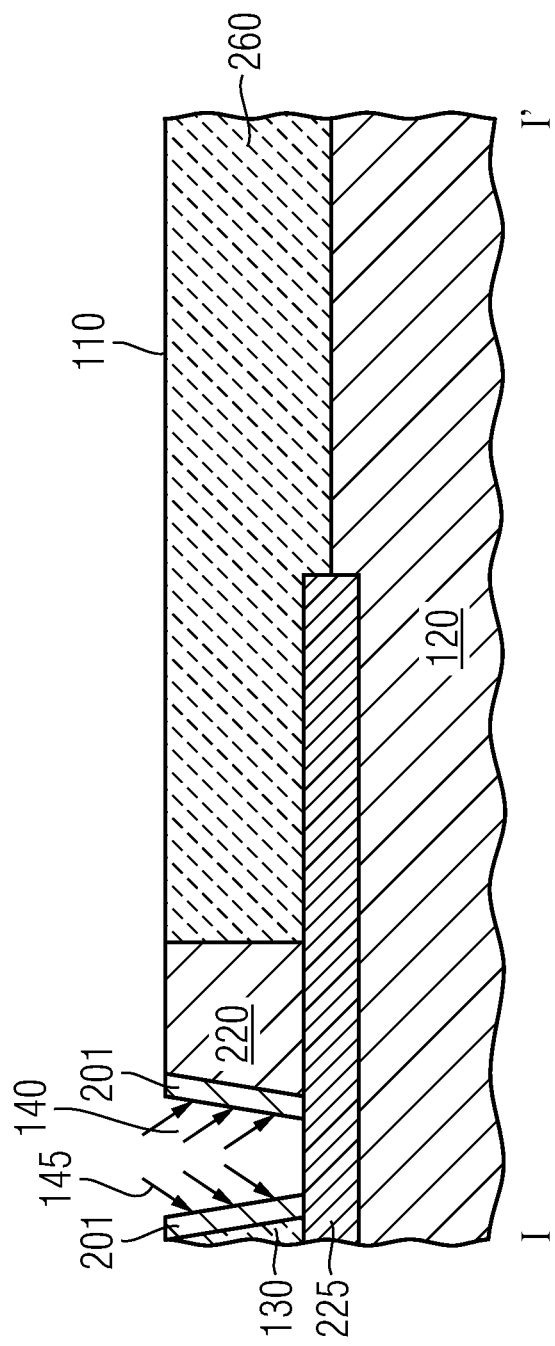

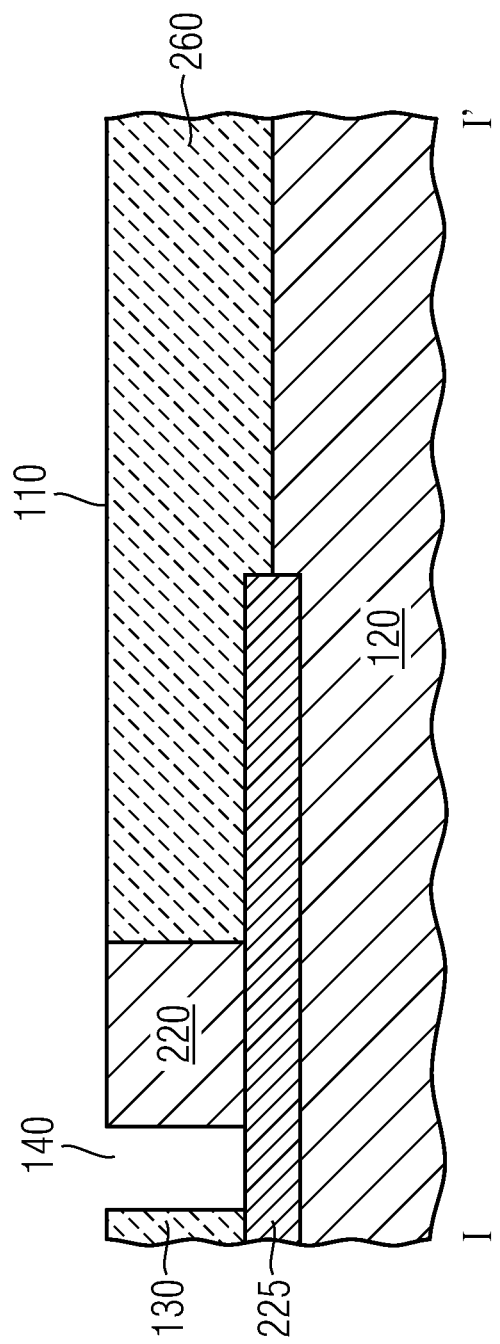

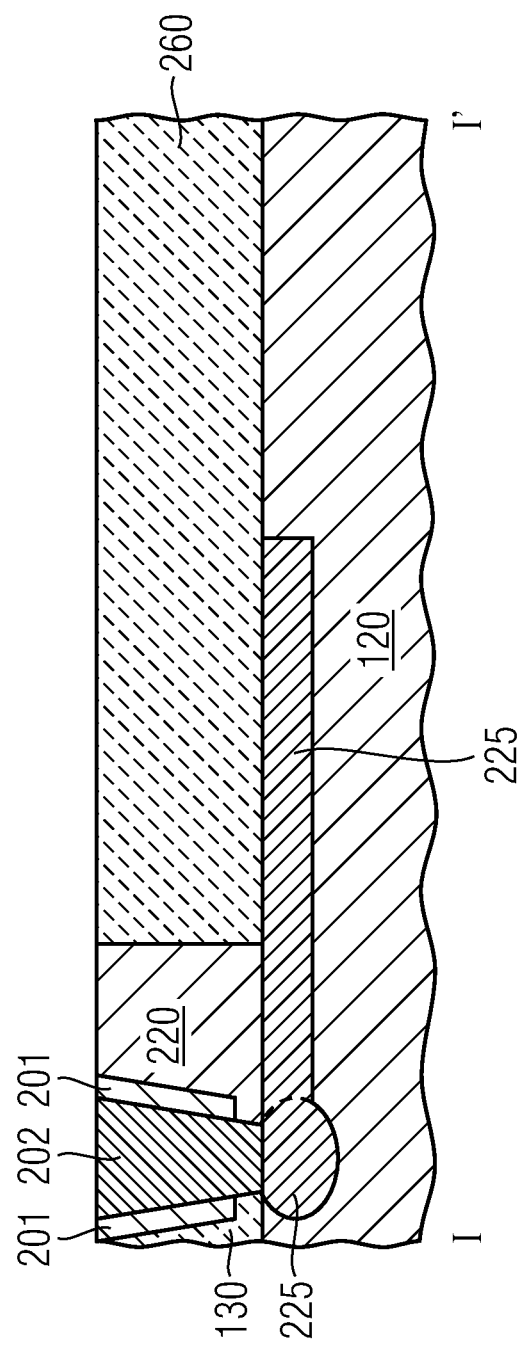

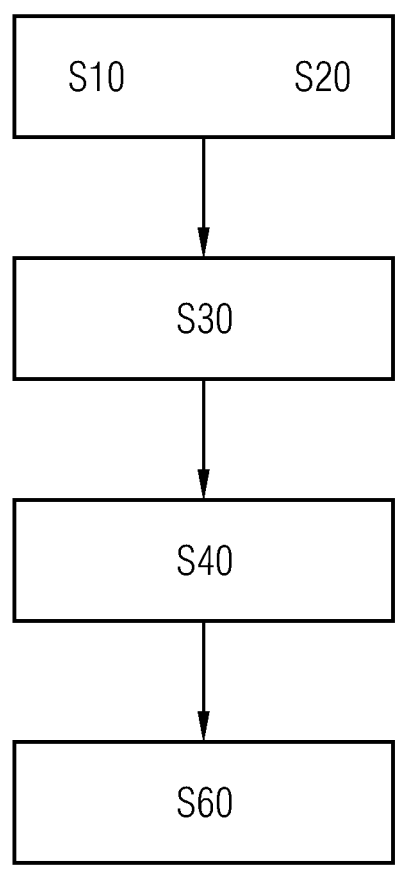

METHOD FOR MANUFACTURING A SEMICONDUCTOR DEVICE AND A SEMICONDUCTOR DEVICE

BACKGROUND

Power transistors commonly employed in automotive and industrial electronics require a low on-state resistance ($R_{on}$), while securing a high voltage blocking capability. For example, a MOS ("metal oxide semiconductor") power transistor should be capable, depending upon application requirements to block drain to source voltages $V_{ds}$ of some tens to some hundreds or thousands of volts. MOS power transistors typically conduct very large currents which may be up to some hundreds of Amperes at typical gate-source voltages of about 2 to 20 V.

Attempts are being made for developing novel concepts for power transistors. In particular, power transistors having an increased channel width are being searched for.

SUMMARY

According to an embodiment, a method of forming a semiconductor device comprises forming a transistor in a semiconductor substrate having a main surface. The method comprises forming a source region and a drain region, forming a channel region and a drift zone arranged between the source region and the drain region, the source region and the drain region being arranged along a first direction parallel to the main surface. The method further comprises forming gate trenches and forming a gate electrode in the gate trenches, the gate trenches having a distance corresponding to a width d1 of the channel region, the width d1 fulfilling: $d1 \leq 2*ld$, where ld denotes a length of a depletion zone formed at an interface between the channel region and a gate dielectric adjacent to the gate electrode. The method additionally comprises forming an auxiliary trench in the main surface, the auxiliary trench extending in a second direction intersecting the first direction. The source region is formed using a doping method that introduces dopants via a sidewall of the auxiliary trench.

According to an embodiment, a semiconductor device comprises a transistor in a semiconductor substrate having a main surface. The transistor comprises source regions and drain regions, each of the source regions and the drain regions being arranged at the main surface, channel regions between the source regions and the drain regions, gate trenches in the main surface, disposed between adjacent ones of the channel regions, gate electrodes in gate trenches, and body contact regions at the main surface, the body contact regions contacting the channel regions. The source regions and the body contact regions are alternatingly disposed along a second direction intersecting the first direction.

According to a further embodiment, an integrated circuit comprises the semiconductor device as defined above.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1A shows a plan view of a semiconductor device according to an embodiment;

FIG. 1B shows a first cross-sectional view of the semiconductor device shown in FIG. 1A;

FIG. 1C shows a cross-sectional view of the semiconductor device shown in FIG. 1A in a direction perpendicular to the direction of the cross-sectional view of FIG. 1B;

FIG. 1D shows a cross-sectional view of another portion of the semiconductor device shown in FIG. 1A.

FIG. 2A shows a cross-sectional view of a semiconductor device when performing the method according to an embodiment;

FIG. 2C shows a cross-sectional view of the substrate after performing a further processing step;

FIG. 2E shows a cross-sectional view of the substrate after performing a further processing step;

FIG. 3A illustrates a cross-sectional view of the substrate when performing a method according to a further embodiment;

FIG. 4B shows a cross-sectional view of the semiconductor device according to a further embodiment;

FIG. 7 shows a flowchart of a method according to an embodiment;

DETAILED DESCRIPTION

Figure 2B:
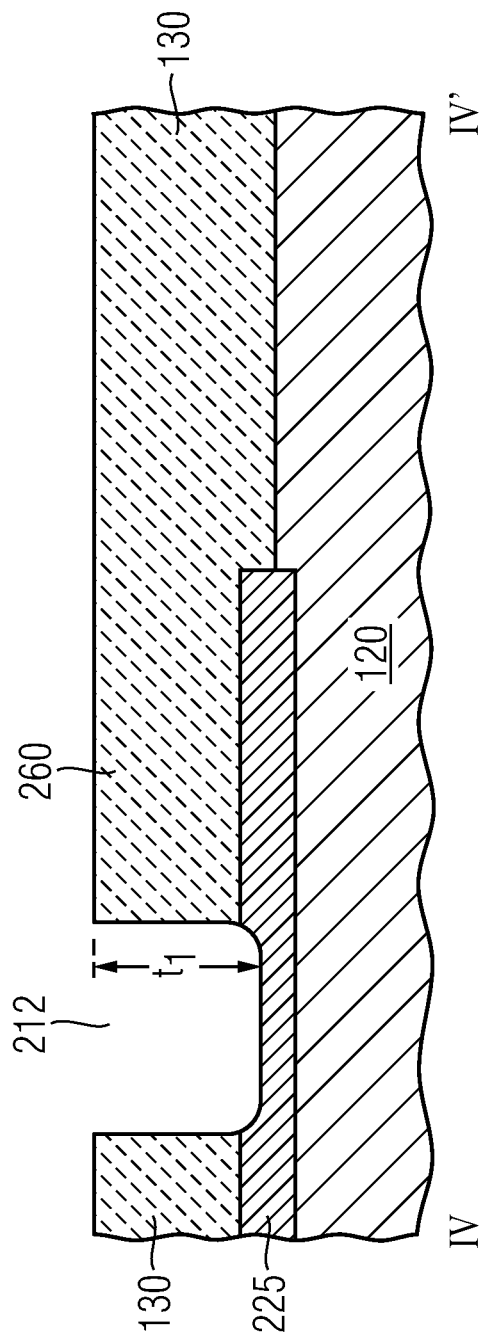
FIG. 2B shows a cross-sectional view of the substrate after performing a further processing step.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intend to describe an orientation parallel to a main surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be re-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

Embodiments are described while specifically referring to so-called normally-off transistors, i.e. transistors which are in an off-state when no gate voltage or a gate voltage of 0V is applied. As is to be clearly understood, the present teaching can be equally applied to normally-on transistors, i.e. transistors which are in a conducting state when no gate voltage or a gate voltage of 0V is applied.

FIG. 1A shows a plan view or, more precisely, a cross-sectional view of a semiconductor device 1 or an integrated circuit which is taken in a plane parallel to a main surface of a semiconductor substrate.

The semiconductor device 1 includes a transistor 200. The transistor 200 shown in FIG. 1A comprises a source region 201, a drain region 205, a channel region 220, and a drift zone 260. The source region 201, the drain region 205 and the drift zone 260 may be doped with dopants of a first conductivity type, for example n-type dopants. The doping concentration of the source and the drain regions 201, 205 may be higher than the doping concentration of the drift zone 260. The channel region 220 is arranged between the source region 201 and the drift zone 260. The channel region 220 is doped with dopants of a second conductivity type, for example with p-type dopants. The drift zone 260 may be arranged between the channel region 220 and the drain region 205. The source region 201, the channel region 220, the drift zone 260 and the drain region 205 are disposed along a first direction parallel to a main surface of the semiconductor substrate. The source region 201 is electrically connected to the source electrode 202. The drain region 205 is electrically connected to the drain electrode 206. The semiconductor device 1 further comprises a gate electrode 210. The gate electrode 210 is insulated from the channel region 220 by means of an insulating gate dielectric material 211 such as silicon oxide.

According to an embodiment, the transistor may further comprise a field plate 250 which is arranged adjacent to the drift zone 260. The field plate 250 is insulated from the drift zone 260 by means of an insulating field dielectric layer 251 such as silicon oxide. The transistor 200 is a lateral transistor. Accordingly, a current flow from the source region 201 to the drain region 205 is mainly accomplished in the first direction parallel to the main surface of the semiconductor substrate.

When a suitable voltage is applied to the gate electrode 210, an inversion layer is formed at the boundary between the channel region 220 or body region and the insulating gate dielectric material 211. Accordingly, the transistor is in a conducting state from the source region 201 to the drain region 205 via the drift zone 260. The conductivity of the channel that is formed in the channel region 220 is controlled by the gate electrode. By controlling the conductivity of the channel formed in the channel region, the current flow from the source region 201 via the channel formed in the channel region 220 and the drift zone 260 to the drain region 205 may be controlled.

When the transistor is switched off, no conductive channel is formed at the boundary between the channel region 220 and the insulating gate dielectric material 211 so that only a sub-threshold current can flow.

According to an embodiment, the transistor may be implemented as a normally-off transistor. According to a further embodiment, the transistor may be implemented as a normally-on transistor. In this case, the channel region 220 may be doped with dopants of the first conductivity type, for example, with n-type dopants.

An appropriate voltage may be applied to the field plate in an off-state. For example, the field plate 250 may be electrically connected to a source terminal, which is also electrically connected to the source electrode 202. In an off-state, the field plate 250 depletes charge carriers from the drift zone 260 so that the breakdown voltage characteristics of the transistor 200 are improved. In a transistor 200 comprising the field plate 250 the doping concentration of the drift zone 260 may be increased without deteriorating the breakdown voltage characteristics in comparison to a device without a field plate. Due to the higher doping concentration of the drift zone, the on-resistance RDSon is further decreased resulting in improved device characteristics.

FIG. 1B illustrates a cross-sectional view of the semiconductor device 1 between I and I' along the first direction, as is also indicated in FIG. 1A. The cross-sectional view of FIG. 1B is taken so as to intersect the channel region 220 and the drift zone 260. As is indicated by dotted lines, gate trenches 212 are disposed adjacent to the channel region 220 in a plane before and behind the depicted plane of the drawing. Further, field plate trenches 252 may be disposed adjacent to the drift zone 260 in a plane before and behind the depicted plane of the drawing. The gate trench 212 and the field plate trench 252 extend from the main surface 110 in a depth direction of the substrate 100. As a consequence, the gate electrode is adjacent to at least two sides of the channel region 220. Further, the channel region 220 has the shape of a first ridge. Due to the presence of the field plate trenches 252, according to an embodiment, the drift zone 260 may have the shape of a second ridge.

The source region 201 extends from the main surface 110 into a depth direction of the substrate 100, i.e. perpendicularly with respect to the main surface 110. The drain region 205 likewise extends from the main surface 110 in a depth direction of the substrate 100.

FIG. 1C illustrates a cross-sectional view of the semiconductor device which is taken between II and II' as is also illustrated in FIG. 1A. The direction between II and II' is perpendicular to the first direction. As is shown in FIG. 1C, the channel region 220 has the shape of a ridge, the ridge having a width d1. For example, the ridge may have a top side, a first sidewall 220b and a second sidewall 220a. The sidewalls 220b, 220a may extend perpendicularly or at an angle of more than 75° with respect to the main surface 110.

As can be gathered from a combination of FIGS. 1B and 1C, the effective width of the transistor depends from the depth t1 of the ridge and, further, from the depth of the source region 202. Differently stated, the effective width of the channel depends from the depth of the gate trenches in which the gate electrode is disposed and from the depth of the source region 202.

As will be explained hereinbelow, the source regions may be formed using an auxiliary trench that extends in a second direction that intersects the first direction between I and I'. For example, the auxiliary trench may be formed in the main surface 110 of the semiconductor substrate, and doping processes to form the source region 201 may be performed using the auxiliary trench. In more detail, doping may be accomplished via a sidewall of the auxiliary trench. For example, the dopants may be introduced into or via the sidewall of the auxiliary trench, the sidewall being disposed on a side of the gate electrode. Thereby, for example, doping may be accomplished to a desired depth of the semiconductor substrate.

FIG. 1B further shows a body contact region 225 that may be disposed beneath the channel regions 220 and beneath a part of the drift zone 260. The body contact region 225 electrically connects the channel region or body region to the source electrode 202 and further suppresses or deteriorates a parasitic bipolar transistor. Moreover, the body contact region 225 may extend beneath the drift zone 260 so that in an off-state of the transistor, the drift zone 260 may be depleted more easily. The body contact region 225 may be doped with dopants of the second conductivity type at a higher concentration than the channel region. In the following, alternative concepts of this body contact regions 225 will be discussed.

Referring to FIG. 1C, the width d1 of the channel region 220 or the body region (e.g. p doped body region) fulfills the following relationship: $d1 \leq 2 \ast l_d$, wherein $l_d$ denotes a length of a depletion zone which is formed at the interface between the gate dielectric layer 211 and the body region or channel region 220. For example, the width of the depletion zone may be determined as:

$$l_d = \sqrt{\frac{4\varepsilon_s kT \ln(N_A/n_i)}{q^2 N_A}}$$

wherein $\varepsilon_s$ denotes the permittivity of the semiconductor material (11.9×$\varepsilon_0$ for silicon, $\varepsilon_0$=8.85×10$^{-14}$ F/cm), k denotes the Boltzmann constant (1.38066×10$^{-23}$ J/K), T denotes the temperature, ln denotes the natural logarithm, $N_A$ denotes the impurity concentration of the semiconductor body, $n_i$ denotes the intrinsic carrier concentration (1.45×10$^{13}$ cm$^{-3}$ for silicon at 27° C.), and q denotes the elementary charge (1.6×10$^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, the width of the first ridges may be approximately 10 to 200 nm, for example, 20 to 60 nm along the main surface 110 of the semiconductor substrate 100.

Moreover, the ratio of length to width may fulfill the following relationship: $s_1/d_1 > 2.0$, wherein s1 denotes the length of the first ridge overlapping with the gate electrode 210, or, differently stated, the length of the channel region, measured along the first direction, as is also illustrated in FIG. 1A. According to further embodiments, $s_1/d_1 > 2.5$.

According to the embodiment in which the width $d1 \leq 2 \ast l_d$, the transistor 200 is a so-called "fully-depleted" transistor in which the body region (e.g. p doped body region) or channel region 220 is fully depleted when the gate electrode 210 is set to an on-voltage. In such a transistor, an optimal sub-threshold voltage may be achieved and short channel effects may be efficiently suppressed, resulting in improved device characteristics.

According to an embodiment, the drift zone 260 may comprise a flat surface which is not patterned to form ridges. According to a further embodiment, the field plate 250 may be arranged in trenches 252 so that the drift zone 260 comprises ridges. In a transistor including a field plate 250, it may be desirable to use a drift zone 260 having a width d2 which is larger than the width d1 of the channel region. Hence, the field plate trenches 252 may be disposed at a larger distance so that the portions of the drift zone 260 which are disposed between adjacent field plate trenches 252, have a larger width. According to another embodiment, d2 may be chosen to be smaller than d1. Typically, the thickness of the field dielectric layer between the field plate and the drift zone is thicker than the thickness of the gate dielectric layer to increase the drain-source breakdown voltage. This may result in a greater pitch of the field plate trenches in comparison with the gate trenches and the separation trenches.

In order to improve the characteristics of the semiconductor device in the channel region and to further improve the device characteristics in the drift zone, patterning the gate electrode and the field plate may be accomplished using an appropriate etching mask so as to provide a different width of the first and second ridges.

According to an embodiment, the gate trenches 212 and the field plate trenches 252 may be separate from each other. According to a further embodiment, the gate trenches 212 and the field plate trenches 252 may be merged so as to form one single trench having different widths.

The semiconductor devices illustrated in FIGS. 1A to 1D implement lateral power transistors. They may be employed in DC/DC or AC/DC converters since they may be integrated in an easy manner. Further, they may achieve high current densities so that they may be employed for small power and voltages between 10V and several hundred Volts.

FIGS. 2A to 2E illustrate a method of manufacturing a semiconductor device according to an embodiment. For example, using this method, the semiconductor device illustrated in FIGS. 1A to 1D may be manufactured.

A semiconductor substrate may be pre-processed by performing shallow trench isolation processes (STI) and implantation steps which are generally known. For example, a well implantation step may be performed so as to form a well implantation portion 120, followed by a further implantation step for providing a body contact region 225 and a doping step for forming the channel region 220 in the substrate material layer 130. Further, an implantation step may be performed so as to define the drift zone 260. In the embodiment shown in FIG. 2A, the drift zone 260 is n-doped whereas the channel region 220 is p-doped. The substrate material layer 130 may be n-doped. The body contact region 225 is heavily p-doped. As is to be clearly understood, the reverse doping types may be applied.

FIG. 2A shows a cross-sectional view between I and I' which is shown in FIG. 1A. In the next step, gate trenches 212 and optionally field plate trenches (not shown in this drawing) are photolithographically defined and etched, optionally, using a hard mask. For example, the gate trenches may have a depth of approximately 500 to 5000 nm, more specifically, 1000 to 2000 nm. The distance between adjacent gate trenches 212 depends on the specific semiconductor device that is to be implemented. For example, in a case in which a fully-depleted transistor is to be formed, a distance may be 30 to 300 nm. Nevertheless, the distance may as well be larger up to, for example, 500 to 1000 nm. The gate trenches 212 are defined so as to pattern the channel region 220 into ridges. FIG. 2B shows an example of a cross-sectional view that is taken between IV and IV', i.e. in a cross-section including gate trenches and in which no field plates are present.

Depending on the structure that is to be implemented, a field plate dielectric layer 251 may be formed and may be removed from unnecessary portions. Then, the gate dielectric layer 211 may be formed, for example, by a thermal oxidation. For example, the gate dielectric layer 211 may have a thickness of 5 to 50 nm. Thereafter, a conductive material forming the gate electrode 210 and, optionally, the field plate 250 is formed. For example, polysilicon may be deposited. For example, the polysilicon layer may have a thickness of 50 to 200 nm. The polysilicon material may be n-doped or may be undoped and may be doped after deposition. Then, the conductive material is patterned so as to form the gate electrode 210 and, optionally, the field plate 250.

FIG. 2C shows an example of a resulting structure. The gate electrode 210 is formed so as to be adjacent to the channel region 220 that is disposed before and behind the depicted plane of the drawing. The gate trenches 212 extend to a depth $t_1$.

Thereafter, an auxiliary trench 140 is defined in the main surface 110 of the semiconductor substrate.

Figure 2D:
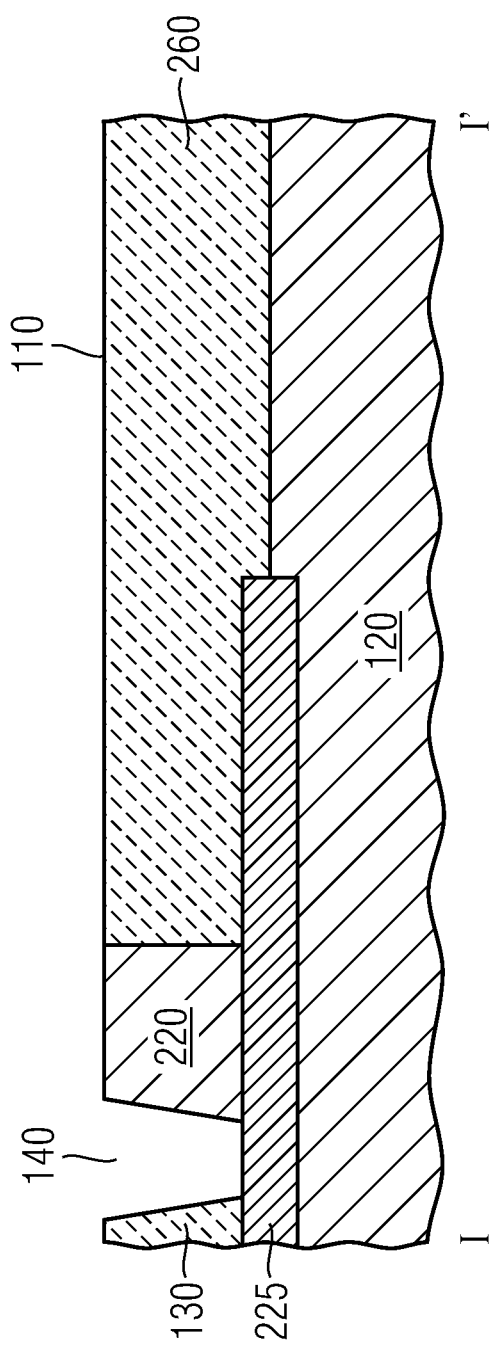
FIG. 2D shows a cross-sectional view of the semiconductor substrate after performing a further processing step.

For example, the auxiliary trench 140 may be photolithographically defined and etched, optionally, using a hard mask layer. For example, the auxiliary trench 140 may be etched so as to have tapered sidewalls. FIG. 2D shows an example of a resulting structure between I and I', i.e. at a portion in which no gate trench is disposed. The auxiliary trench 140 may be formed adjacent to the channel region 220. For example, the auxiliary trench 140 may extend to a depth of approximately 500 to 5000 nm. For example, the auxiliary trench 140 may extend to approximately the same depth or less than the depth of the gate trenches 212. The term "approximately the same depth" is intended to mean that due to process induced variations, the depth of any of the auxiliary trench 140 may be about 10% less or more than the depth of the gate trenches 212.

The dopants for forming the source region 201 may be introduced via the sidewalls of the auxiliary trench 140. For example, a tilted ion implantation step 145 may be performed so as to dope the substrate material that is adjacent to the sidewalls of the auxiliary trench 140. Thereby, the source region 201 may be formed adjacent to the sidewall of the auxiliary trench 140.

FIG. 2E shows an example of a cross-sectional view of a substrate when performing a tilted ion implantation process 145. According to a further embodiment, the auxiliary trench 140 may be filled with a doped material such as a doped oxide or doped silicon material, followed by a diffusion process. Thereafter, the doping material may be removed from the auxiliary trench 140. A conductive material may be filled in the auxiliary trench 140, thereby forming the source electrode 202. Suitable conductive materials comprise heavily doped polysilicon, silicide, for example, metal silicide, metals and combinations of these materials.

According to a further embodiment, the auxiliary trench may be formed to have sidewalls that are approximately perpendicular with respect to the main surface. For example, an anisotropic etching process may be employed.

FIG. 3A shows an example of an auxiliary trench 140 having sidewalls that are approximately perpendicular with respect to the main surface 110. Then, a doping process may be performed such as plasma-assisted doping (PLAD) including an isotropic doping process 147.

Figure 3B:
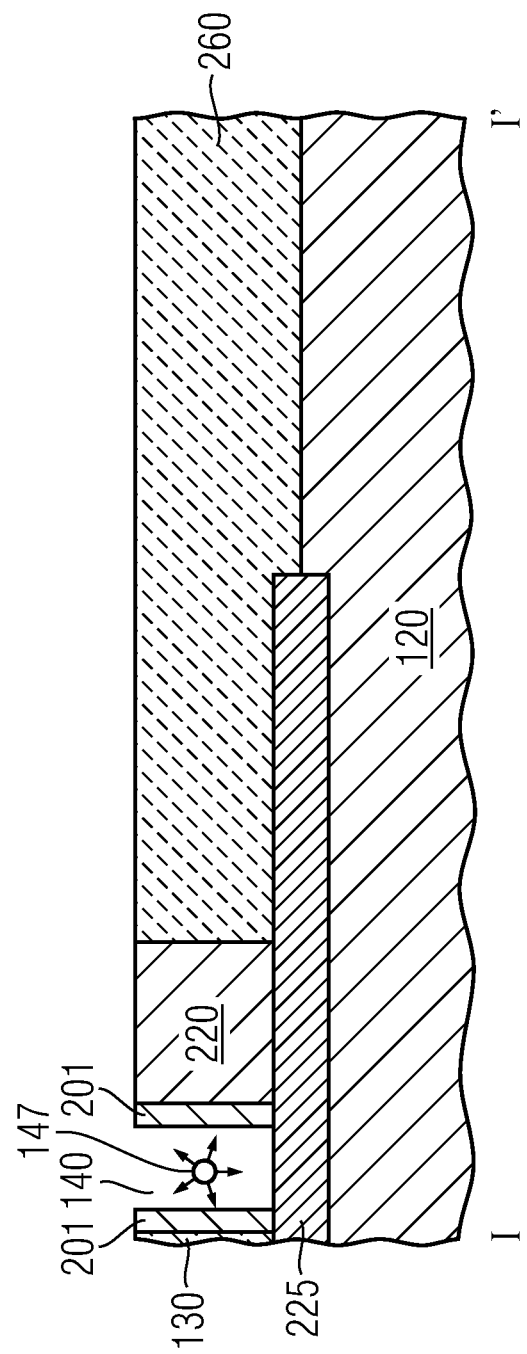
FIG. 3B shows a cross-sectional view of the substrate when performing the further method.

FIG. 3B shows an example of the semiconductor substrate when performing such an isotropic doping method 147. Due to this doping process, the source regions 201 are formed adjacent to the sidewalls of the auxiliary trench 140. According to an alternative, a doped material such as doped phosphorous oxide, doped silicon oxide, doped polysilicon, a glass that is formed by a CVD (chemical vapour deposition) method, a doped material formed by a selective epitaxial method or any other doped material may be filled in the auxiliary trench 140, followed by a diffusion process to form the source regions 201. Then, a conductive material may be deposited in the auxiliary trench, in the manner as has been discussed above.

According to a further embodiment, the auxiliary trench 140 may additionally be used for forming the body contact region 225. According to this embodiment, the bottom portion of the auxiliary trench 140 is doped with dopants of the first conductivity type to form the body contact regions 225. Thereafter, a sacrificial material 150 is formed over the bottom portion of the auxiliary trench 140. For example, the sacrificial material 150 may include silicon oxide which may be formed by a high density plasma method, in which only the horizontal portions of the auxiliary trench 140 are covered with a silicon oxide material. Then, a further doping process may be performed so as to form the source regions 201 adjacent to the sidewalls of the auxiliary trench 140.

Figure 4A:
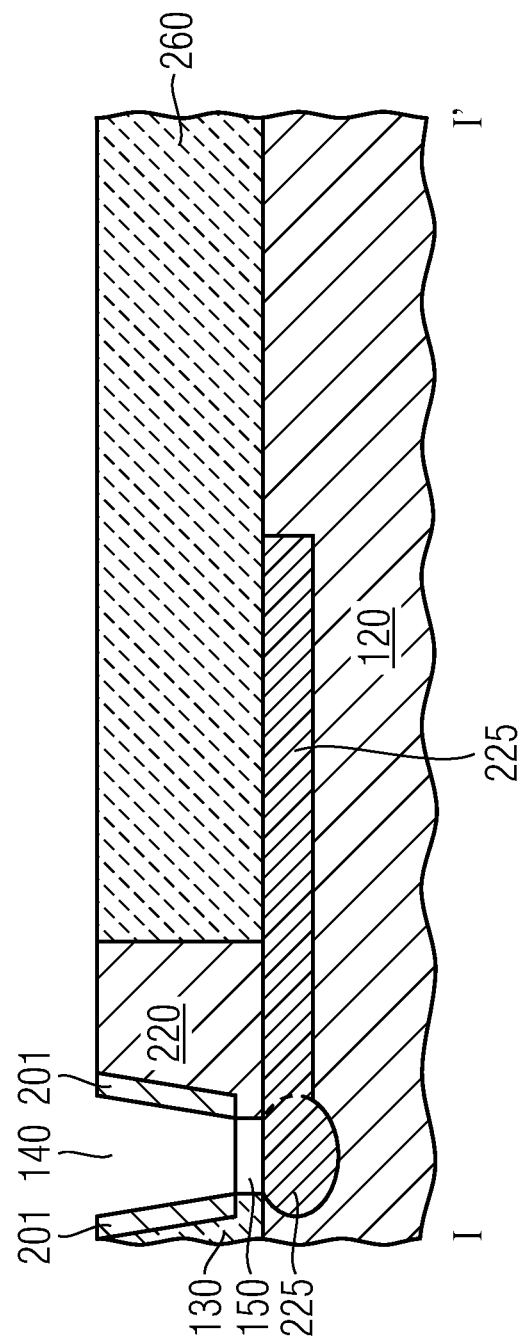
FIG. 4A shows a cross-sectional view of the semiconductor substrate when performing a method according to still a further embodiment.

FIG. 4A shows an example of resulting structure. As is shown, the body contact region 225 is disposed below the bottom side of the auxiliary trench 140, and the source region 201 is formed at a portion above the sacrificial material 150. FIG. 4A further shows a portion of the buried body contact region 225 extending below the channel region and, optionally further below the drift zone 260. The portion of the buried body contact region 225 extending below the channel region may also be dispensed with. Thereafter, the sacrificial material 150 will be removed, followed by a step of forming a conductive material to form the source electrode 202. Examples of the conductive material comprise the materials as discussed above.

FIG. 4B shows an example of resulting structure. As is shown, the source electrode 202 is electrically connected to the source region 201 and to the body contact region 225.

Figure 5A:
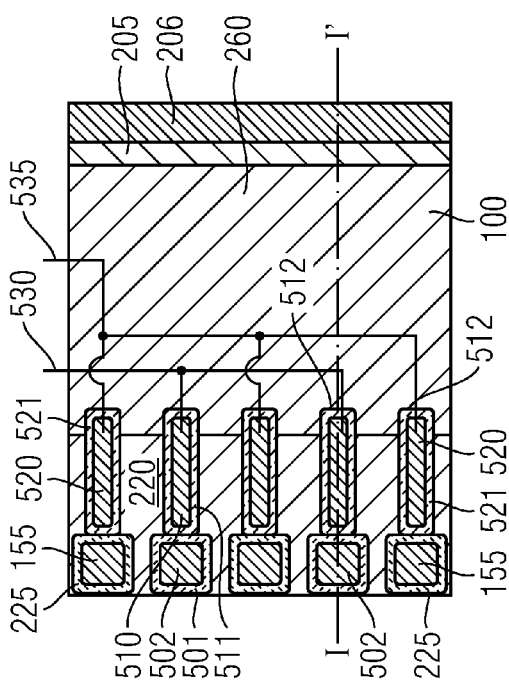
FIG. 5A shows a plan view of a semiconductor device according to an embodiment.

FIG. 5A shows a plan view of a semiconductor device according to a further embodiment. According to the embodiment shown in FIG. 5A, the semiconductor device is formed in a semiconductor substrate 100 having a main surface 110. The transistor comprises a source region 201 and a drain region 205, a channel region 220 and a drain region 205. The source region 501 and the drain region 205 are arranged along a first direction parallel to the main surface. The gate electrode 510 is disposed in gate trenches 512 formed in the main surface of the semiconductor substrate 100. The gate trenches 512 may be similar to the gate trenches 212 illustrated in FIG. 1B, for example. The semiconductor device further comprises body contact regions 225 that are formed in the main surface. As is shown in FIG. 5A, the semiconductor device further comprises source contacts 502 in contact with the source regions 501. The source regions 501 and the body contact regions 225 are alternatingly disposed along a second direction that intersects the first direction. The number of gate trenches 512 may correspond to the sum of source regions 501 and body contact regions 225.

The gate electrodes 510 shown in FIG. 5A are coupled to a gate terminal 530. Further, the conductive material 520 in the gate trenches 512 that are adjacent to the body contact regions 225 may be connected with a terminal that is different from a gate terminal. For example, the terminal 535 may be the source terminal. According to a further embodiment, the gate trenches 512 adjacent to the body contact regions may be filled with an insulating material. According to a further embodiment, all the gate trenches 512 may have a conductive filling that is connected to the gate terminal 530. According to the embodiment illustrated in FIG. 5A, a conductive material 155 is adjacent and electrically connected to the body contact region 225. Further, the source electrode 502 is adjacent and electrically connected to the source region 501. The source electrode 502 and the conductive material 155 are electrically connected to a source terminal. According to a further embodiment, the source electrodes 502 and the conductive material 155 may be portions of one conductive filling within the auxiliary trenches. According to this embodiment, source regions 501 and body contact regions 225 are disposed in an alternating manner between the conductive filling and the adjacent gate trenches 512. In the arrangement shown in FIG. 5A, due to the dimensions of the source region 501 and the body contact regions 225, measured in the second direction, the distance between adjacent gate trenches 512 and, thus, the width d1 of the channel region, may be larger than the length of the depletion zone that is formed at the interface between the gate dielectric layer 511 and the channel region 220. As a consequence, the transistor may not implement a "fully-depleted" transistor in which the channel region 220 is fully depleted when the gate electrode 210 is set to an on-voltage. For example, the width d1 of the channel region may be 150 to 300 nm, for example, 200 to 250 nm.

Figure 5B:
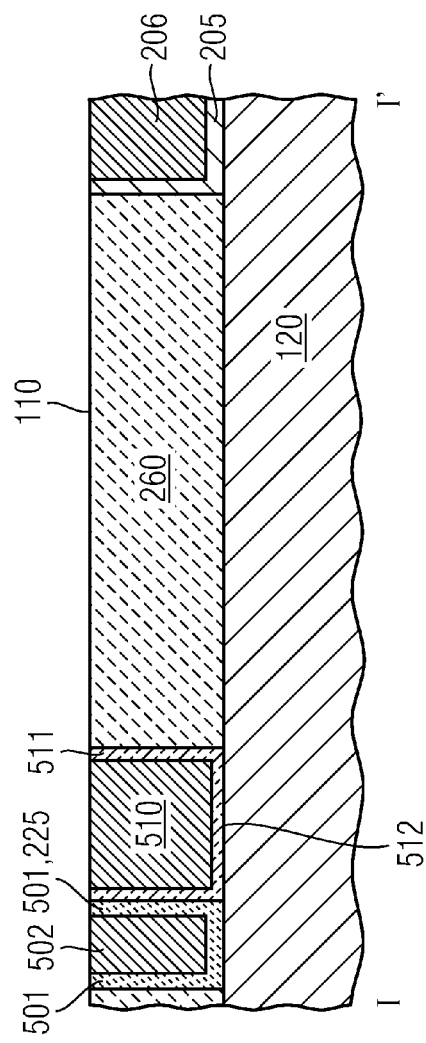
FIG. 5B shows a cross-sectional view of the semiconductor device according to a further embodiment.

FIG. 5B shows a cross-sectional view of the semiconductor device between I and I', as is also shown in FIG. 5A. Gate trenches 512 are formed in the main surface 110 of the semiconductor substrate 100. For example, the gate trenches 512 may be filled with a conductive material forming the gate electrode 510. Further, a gate dielectric material 511 may be disposed between the gate electrode 510 and adjacent substrate material. A doped portion 501, 225 may be disposed adjacent to the gate trench 512. For example, the doped portion may implement a source region 501, that is, for example, doped with dopants of a first conductivity type, for example, n type dopants. Alternatively, the doped portion 225 may be doped with dopants of the second conductivity type to implement the body contact region 225. A conductive material 502, 155 may be formed adjacent to the doped portion and may be electrically connected to the doped portion. The conductive material 502, 155 may be connected to the source terminal.

The channel region 220 is disposed in a plane before and behind the depicted plane of the drawing. The channel region 220 and the drift zone 260 are disposed between the source region 501 and the drain region 205. The drain region 205 may extend to an arbitrary depth. Depending on the precise position of the cross-sectional view, either the source region 501 or the body contact region 225 may be disposed adjacent to the gate trench 512. As has been discussed with reference to FIG. 5A, the conductive material 510 inside the gate trenches 512 is electrically connected to the gate terminal in case the adjacent doped portion implements the source region 501. When the adjacent doped portion implements the body contact region 225, the conductive filling of the gate trench 512 may be connected to the source terminal 535 or may be an insulating filling.

Figure 6A:
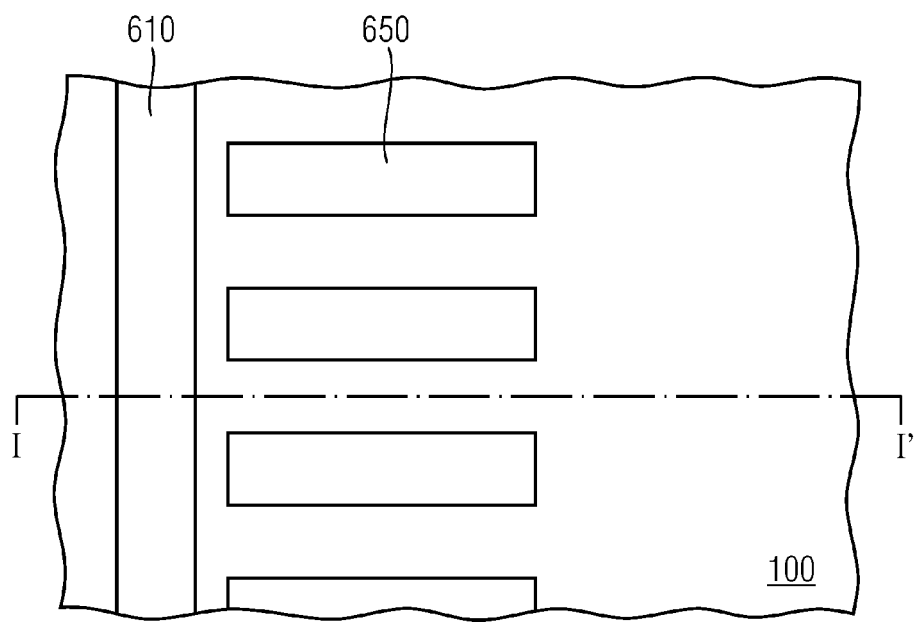
FIG. 6A shows a plan view of a semiconductor device according to a further embodiment.

FIGS. 6A to 6D illustrate a method of manufacturing the semiconductor device of FIG. 5. Starting point is a semiconductor device including gate trenches 650 and an auxiliary trench 610. FIG. 6A shows a plan view of such a semiconductor substrate 100. For example, the semiconductor substrate 100 may be processed in a manner that has been explained with reference to FIGS. 2A to 2D, without forming the buried body contact region 225. Although not explicitly shown, a channel region 220 and a drift zone 260 have been formed in the semiconductor substrate 100 in a manner as is conventional.

Figure 6B:
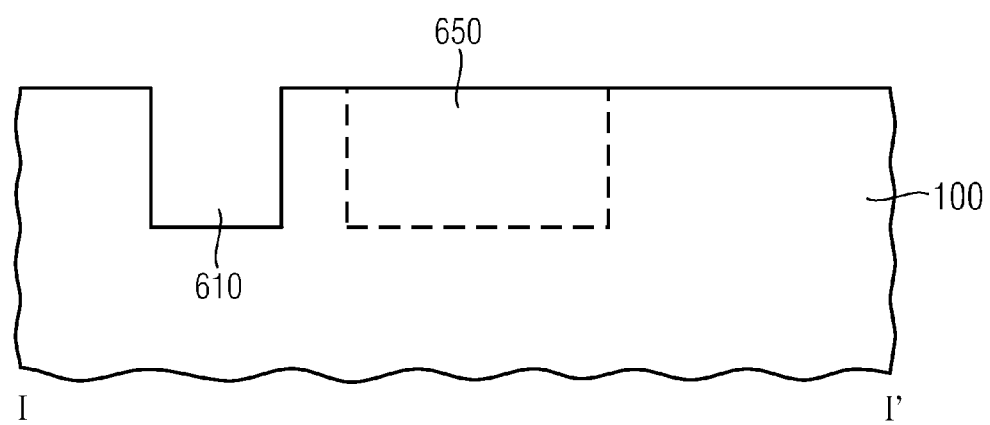
FIG. 6B shows a cross-sectional view of the semiconductor device according to an embodiment.

FIG. 6B shows a cross-sectional view of the semiconductor substrate 100 between I and I', as is also illustrated in FIG. 6A. As is shown, an auxiliary trench 610 is formed adjacent to the gate trenches 650 that are indicated by broken lines. Thereafter, a sacrificial layer comprising a sacrificial material such as silicon oxide is formed over the surface to fill the auxiliary trench 610. Then, a photoresist layer 640 is formed over the surface of the sacrificial layer 630.

Figure 6C:
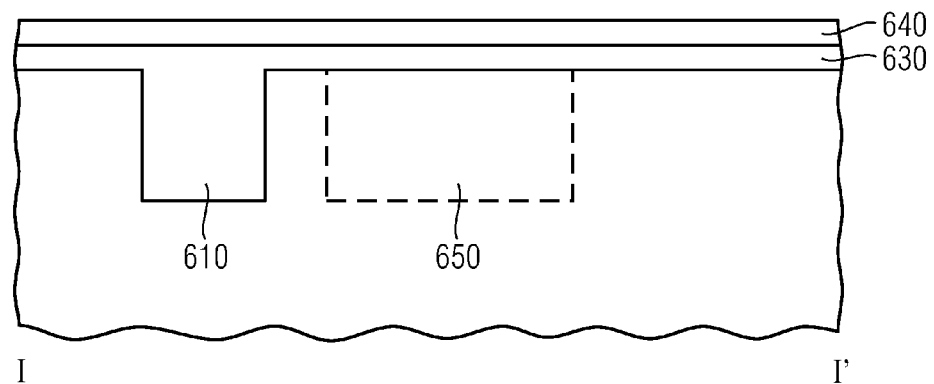
FIG. 6C shows a cross-sectional view of the substrate when performing the method according to an embodiment.
Figure 6D:
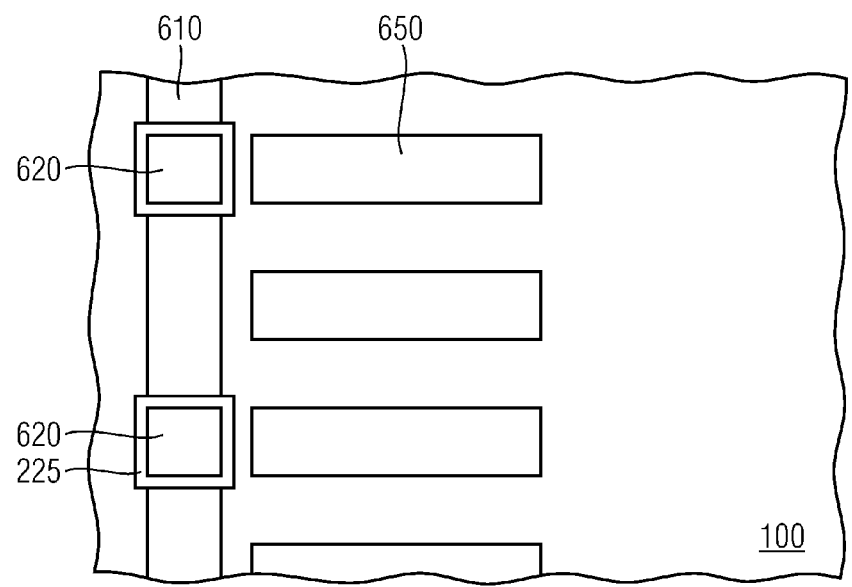
FIG. 6D shows a plan view of the semiconductor device when performing the method according to an embodiment.

FIG. 6C shows a cross-sectional view of a resulting structure. Openings are photolithographically defined in the photoresist layer 640, followed by etching to form the first openings 620. For example, the first openings may have a width of approximately 0.2 to 0.7 μm, for example, 0.3 to 0.5 μm. Using the first openings 620 as a doping mask, a doping process may be performed so as to dope the uncovered sidewalls adjacent to the corresponding gate trenches 650. As is specifically shown in FIG. 6D, the first openings 620 are formed so as to be adjacent to every second gate trench 650. The doping process may be performed in any arbitrary manner, for example, using any of the methods that have been explained above with reference to FIGS. 2 to 4. To be more specific, doping from the gas phase may be implemented or using gas phase materials. Alternatively, the first openings 620 may be filled with a doping material such as doped phosphorous oxide, doped silicon oxide, or silicon or a doped glass. For example, doping with dopants of the second conductivity type may be performed so as to form body contact regions 225.

After performing the first doping process, the resulting structure may be covered by a further photoresist layer and second openings 625 may be defined at positions between two adjacent first openings 620. The size of second openings 625 may be equal to the size of the first openings 620. Thereafter, a further doping process may be performed so as to dope the sidewalls adjacent to the corresponding trenches 650. For example, doping with dopants of the first conductivity type may be performed so as to form the source regions 501. The second doping process may be performed using similar doping methods as have been explained above. According to an implementation, the second openings 625 may be filled with a filling that is doped with dopants of the first conductivity type.

Figure 6E:
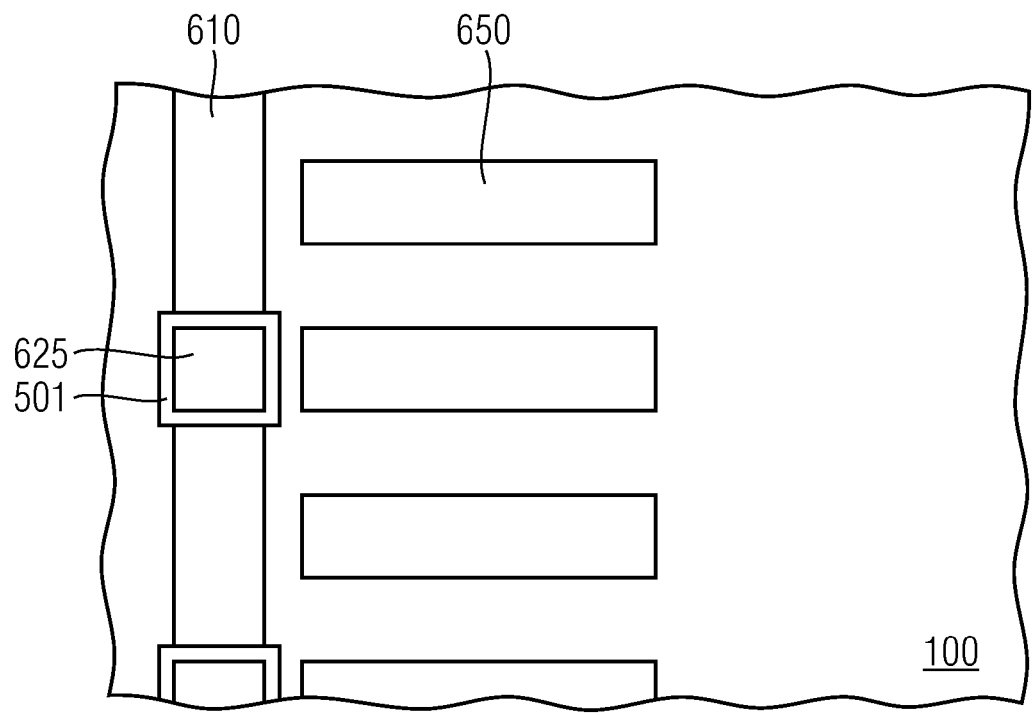
FIG. 6E shows a plan view of the semiconductor device after performing a further processing step.

FIG. 6E shows a plan view of an example of a resulting substrate including the second openings 625.

Figure 6F:
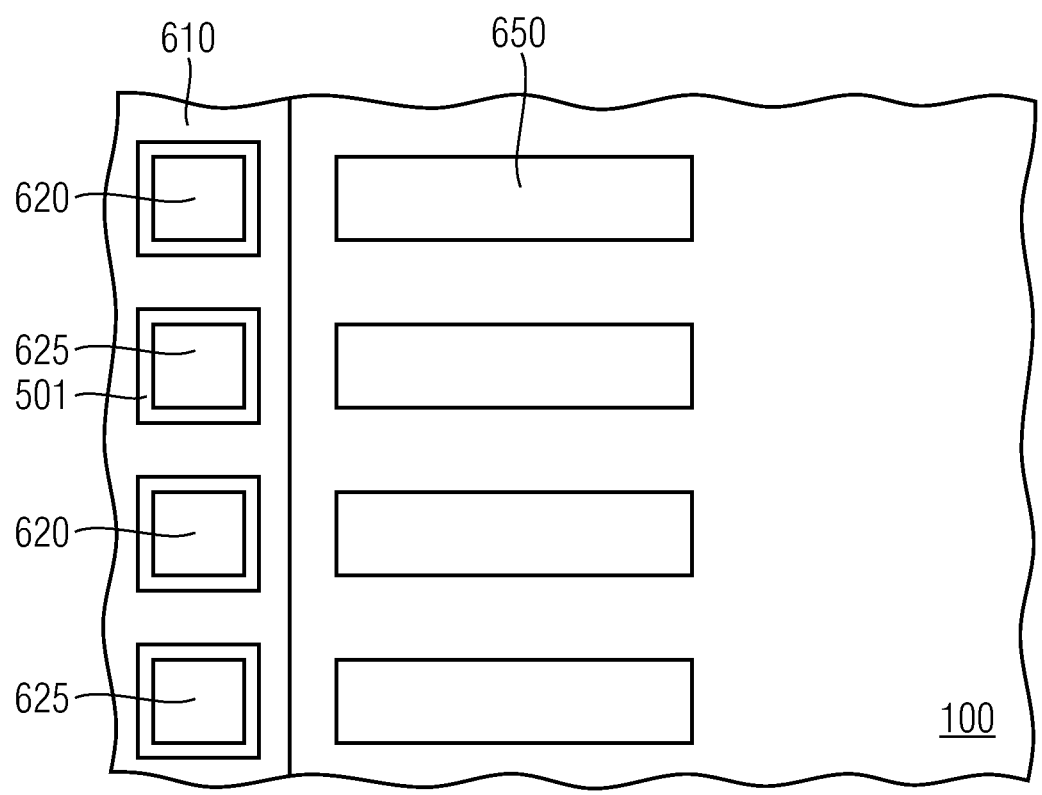
FIG. 6F shows a plan view of the semiconductor device after performing yet a further processing step.

FIG. 6F shows a plan view of an example of a resulting structure after removing the photoresist layer. As is shown, the first openings 620 and the second openings 625 are arranged in an alternating manner. Thereafter, for example, a heat treatment may be performed so as to conduct a diffusion process from the first and from the second openings. Then, further processes may be performed in order to provide further components of the semiconductor device.

For example, the sacrificial material may be removed from the space between the first and the second openings 620, 625. Then, the substrate portions between the first and the second openings 620, 625 may be epitaxially overgrown. Optionally, the filling of the first and the second openings 620, 625 may be removed. A conductive material may be filled in the first and in the second openings 620, 625 to provide an electrical connection to a source terminal. Suitable conductive materials comprise heavily doped polysilicon, silicide, for example, metal silicide, metals and combinations of these materials. These materials may be formed by generally known methods.

FIG. 7 summarizes the method of forming a semiconductor device according to an embodiment. A method of forming a semiconductor device comprises forming a transistor in a semiconductor substrate having a main surface. The method comprises forming a source region (S60) and a drain region, forming a channel region and a drift zone (S10) arranged between the source region and the drain region. The source region and the drain region are arranged along a first direction parallel to the main surface. The method further comprises forming gate trenches (S20) and forming a gate electrode (S30) in the gate trenches, the gate trenches having a distance corresponding to a width d1 of a channel region, the width d1 fulfilling: $d1 \leq 2*ld$, where ld denotes a length of a depletion zone formed at an interface between the channel region and a gate dielectric adjacent to the gate electrode. The method further comprises forming an auxiliary trench (S40) in the main surface, the auxiliary trench extending in a second direction intersecting the first direction. The source region is formed using a doping method that introduces dopants via a sidewall of the auxiliary trench.

Figure 8A:
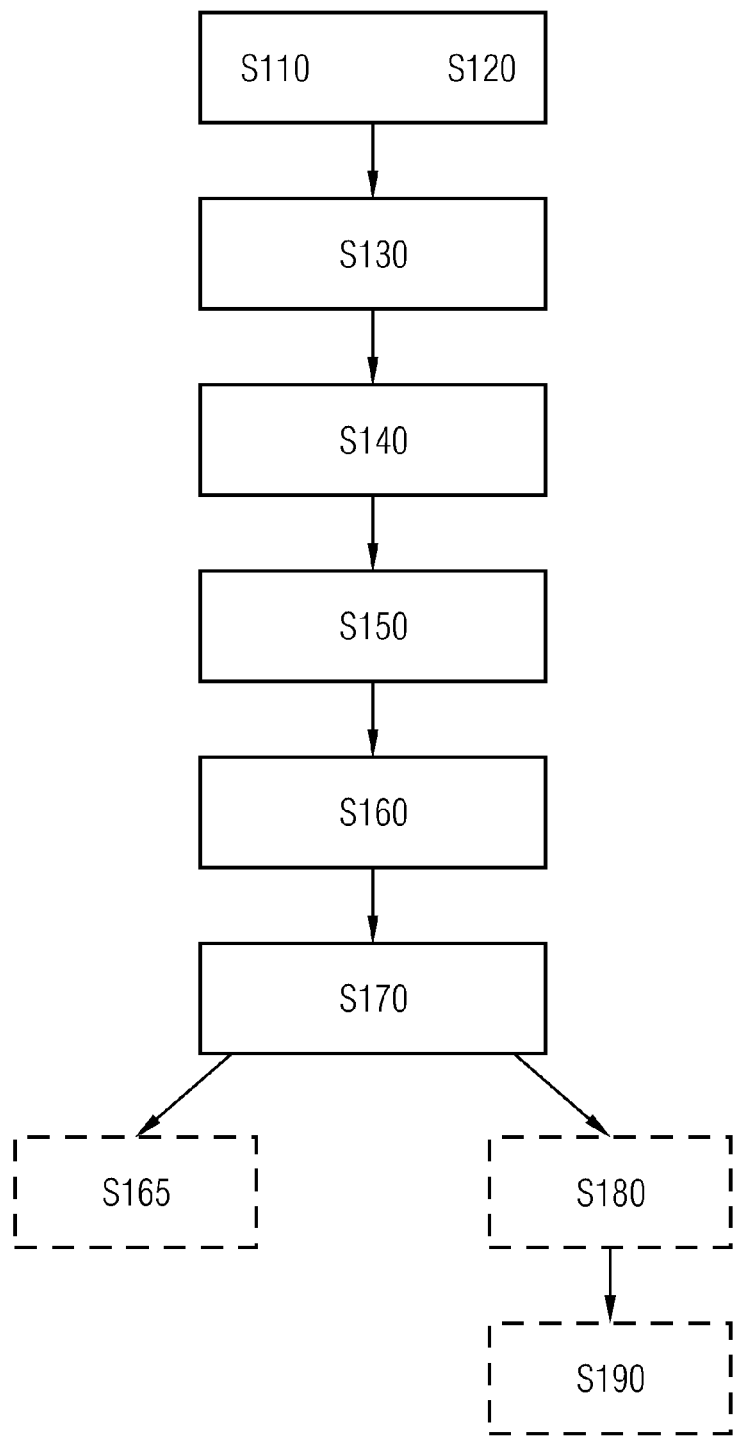
FIG. 8A shows a flowchart of a method according to a further embodiment.

FIG. 8A summarizes a further method of forming a semiconductor device according to an embodiment. The method comprises forming a transistor in a semiconductor substrate having a main surface. The method comprises forming a source region and a drain region (S165), forming a channel region and a drift zone (S110) arranged between the source region and the drain region. The source region and the drain region are arranged along a first direction parallel to the main surface. The method further comprises forming gate trenches (S120) and forming a gate electrode (S130) in the gate trenches, and forming an auxiliary trench (S140) in the main surface, the auxiliary trench extending in a second direction intersecting the first direction. The method further comprising forming a sacrificial material (S150) filling the auxiliary trench, forming first openings (S160) in the sacrificial material and performing a first doping process to form a body contact region by doping a substrate material adjacent to the first openings (S170). The source region is formed using a doping method that introduces dopants via a sidewall of the auxiliary trench. For example, forming the source region may comprise forming second openings (S180) in the sacrificial material and performing a second doping process (S190) to form a source region by doping the substrate material adjacent to the second openings.

Figure 8B:
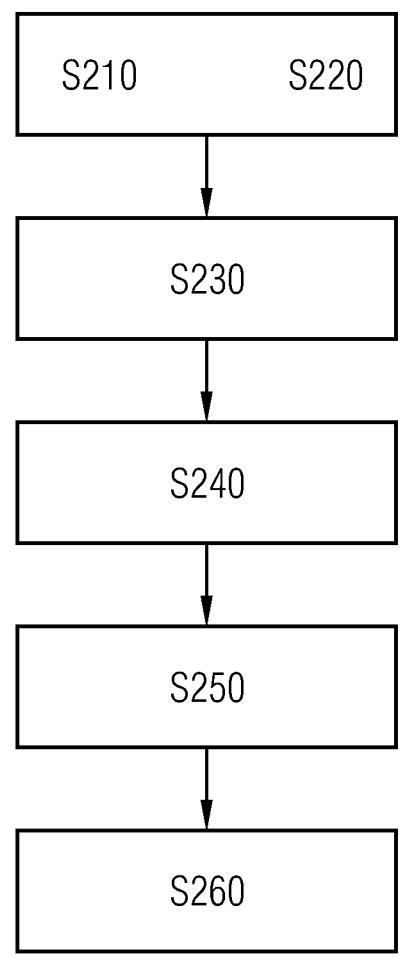
FIG. 8B shows a flowchart of a method according to still a further embodiment.

FIG. 8B summarizes a method of forming a semiconductor device according to an embodiment. The method comprises forming a transistor in a semiconductor substrate having a main surface. The method comprises forming a source region and a drain region (S260), forming a channel region and a drift zone (S210) arranged between the source region and the drain region. The source region and the drain region are arranged along a first direction parallel to the main surface. The method further comprises forming gate trenches (S220) and forming a gate electrode (S230) in the gate trenches, and forming an auxiliary trench (S240) in the main surface, the auxiliary trench extending in a second direction intersecting the first direction. The method further comprises doping a substrate portion adjacent to a bottom side of the auxiliary trench with dopants of a first conductivity type to form a body contact region (S250). Forming the source region (S260) comprises doping a substrate portion adjacent to the main surface with dopants of a second conductivity type to form the source region.

As has been explained above, the described embodiments provide a possibility to increase the channel width of a transistor, whereby the resistivity of the power transistor may be decreased. Due to the methods described, reduced switching losses and an increased robustness of the power transistor may be achieved. Further, the described semiconductor device has a low-ohmic body contact region electrically connecting the source terminal with the body region. Thereby, the switching resistivity of the transistor may be reduced. Further, for example, when the polarity of the body diode is reversed or an avalanche breakdown is going to take place, a large amount of holes may be discharged via the source terminal. Thereby, the robustness of the transistor may be increased.

What is claimed is:

1. A method of forming a semiconductor device comprising forming a transistor in a semiconductor substrate having a main surface, the method further comprising:
   forming a source region and a drain region;
   forming a channel region and a drift zone arranged between the source region and the drain region, the source region and the drain region being arranged along a first lateral direction that is parallel to the main surface;
   forming gate trenches and a gate electrode in the gate trenches; and
   forming an auxiliary trench in the main surface, the auxiliary trench extending in a second lateral direction that is parallel to the main surface and that intersects the first lateral direction, the source region being formed using a doping method that introduces dopants via a sidewall of the auxiliary trench.

2. The method according to claim 1, wherein forming the auxiliary trench comprises an anisotropic etching process to form the auxiliary trench having sidewalk that are approximately perpendicular with respect to the main surface.

3. The method according to claim 1, wherein the doping method is selected from the group consisting of ion implantation, plasma assisted doping, doping via CVD glasses, doped selective epitaxial processes, and deposition of p or n doped polysilicon.

4. The method according to claim 1, wherein the doping method comprises depositing a doping layer on a sidewall of the auxiliary trench, the doping layer including the dopant, and performing a diffusion process.

5. The method according to claim 1, wherein forming the auxiliary trench comprises an etching process to form the auxiliary trench having tapered sidewalls.

6. The method according to claim 1, further comprising:
   forming a sacrificial material filling the auxiliary trench;
   forming first openings in the sacrificial material; and
   performing a first doping process to form a body contact region by doping a substrate material adjacent to the first openings.

7. The method according to claim 6, further comprising:
   forming second openings in the sacrificial material; and
   performing a second doping process to form a source region by doping the substrate material adjacent to the second openings.

8. The method according to claim 1, further comprising:
   doping a substrate portion adjacent to a bottom side of the auxiliary trench with dopants of a first conductivity type to form a body contact region; and
   doping a substrate portion adjacent to the main surface with dopants of a second conductivity type to form the source region.

9. The method according to claim 1, wherein the auxiliary trench has a depth approximately equal to the depth of the gate trenches.

10. A semiconductor device comprising a transistor in a semiconductor substrate having a main surface, the transistor comprising:
    source regions and drain regions, each of the source regions and the drain regions being arranged along a first lateral direction that is parallel to the main surface;
    channel regions between the source regions and the drain regions;
    gate trenches in the main surface, disposed between adjacent ones of the channel regions;
    gate electrodes in the gate trenches; and
    body contact regions at the main surface, the body contact regions contacting the channel regions,
    wherein the source regions and the body contact regions are alternatingly disposed along a second lateral direction that is parallel to the main surface and that intersects the first direction.

11. The semiconductor device according to claim 10, wherein the source regions are doped with dopants of a first conductivity type, and the body contact regions are doped with dopants of a second conductivity type.

12. The semiconductor device according to claim 11, wherein the source regions are electrically connected to the body contact regions.

13. The semiconductor device according to claim 10, further comprising auxiliary trenches at the body contact regions.

14. The semiconductor device according to claim 13, wherein the gate trenches are filled with a conductive filling that is electrically connected to a gate terminal.

15. The semiconductor device according to claim 14, wherein the auxiliary trenches are filled with a conductive filling that is electrically connected to a source terminal.

16. The semiconductor device according to claim 13, wherein the auxiliary trenches are filled with an insulating material.

17. The semiconductor device according to claim 10, further comprising a drift zone between the channel region and the drain region.

18. The semiconductor device according to claim 13, wherein the gate trenches and the auxiliary trenches extend to approximately the same depth as the source regions.

19. The semiconductor device according to claim 13, wherein the gate trenches and the auxiliary trenches extend to approximately the same depth as the body contact regions.

20. An integrated circuit comprising the semiconductor device according to claim 10.

21. A method of forming a semiconductor device comprising forming a transistor in a semiconductor substrate having a main surface, the method further comprising:
- forming a source region and a drain region;
- forming a channel region and a drift zone arranged between the source region and the drain region, the source region and the drain region being arranged along a first lateral direction that is parallel to the main surface;
- forming gate trenches and a gate electrode in the gate trenches; and
- forming an auxiliary trench in the main surface, the auxiliary trench extending in a second lateral direction that is parallel to the main surface and that intersects the first direction, the source region being formed using a doping method that introduces dopants via a sidewall of the auxiliary trench;
- forming a sacrificial material filling the auxiliary trench;
- forming first openings in the sacrificial material; and
- performing a first doping process to form a body contact region by doping a substrate material adjacent to the first openings.

* * * * *

UNITED STATES PATENT AND TRADEMARK OFFICE
CERTIFICATE OF CORRECTION

PATENT NO. : 9,449,968 B2
APPLICATION NO. : 14/141832
DATED : September 20, 2016
INVENTOR(S) : P. Irsigler et al.

It is certified that error appears in the above-identified patent and that said Letters Patent is hereby corrected as shown below:

In the Claims

Column 13, Line 47 (Claim 2, Line 3) please change "sidewalk" to -- sidewalls --

Signed and Sealed this
Third Day of January, 2017

Michelle K. Lee
*Director of the United States Patent and Trademark Office*